US008247977B2

(12) United States Patent
Vinogradov et al.

(10) Patent No.: US 8,247,977 B2
(45) Date of Patent: Aug. 21, 2012

(54) INDUCTION COIL, A PLASMA GENERATOR AND A PLASMA GENERATING METHOD

(75) Inventors: Georgy K. Vinogradov, Sagamihara (JP); Vladimir M. Menagarishvili, Sagamihara (JP); Tetsuhiko Shimamura, Sagamihara (JP); Masayuki Nakamura, Sagamihara (JP)

(73) Assignee: Lam Research Corporation, Fremont, CA (US)

( * ) Notice: Subject to any disclaimer, the term of this patent is extended or adjusted under 35 U.S.C. 154(b) by 267 days.

(21) Appl. No.: 12/509,434

(22) Filed: Jul. 24, 2009

(65) Prior Publication Data
US 2009/0278459 A1 Nov. 12, 2009

Related U.S. Application Data

(63) Continuation of application No. PCT/JP2008/052461, filed on Feb. 14, 2008.

(30) Foreign Application Priority Data

Feb. 16, 2007 (JP) ................................ 2007-037036

(51) Int. Cl.
H05H 1/24 (2006.01)
H01F 27/29 (2006.01)
(52) U.S. Cl. .............. 315/111.51; 315/111.21; 336/192; 156/345.48
(58) Field of Classification Search ............. 315/111.21, 315/111.51; 156/345.48; 336/192
See application file for complete search history.

(56) References Cited

U.S. PATENT DOCUMENTS

| 4,948,458 | A | | 8/1990 | Ogle |
|---|---|---|---|---|
| 5,944,899 | A | * | 8/1999 | Guo et al. .................... 118/715 |
| 6,308,654 | B1 | * | 10/2001 | Schneider et al. .......... 118/723 I |
| 6,441,555 | B1 | * | 8/2002 | Howald et al. ........... 315/111.51 |
| 6,798,326 | B2 | * | 9/2004 | Iida .............................. 336/200 |
| 6,893,533 | B2 | * | 5/2005 | Holland et al. ........... 156/345.48 |
| 7,135,089 | B2 | * | 11/2006 | Okumura et al. ......... 156/345.48 |
| 2004/0223579 | A1 | * | 11/2004 | Lee et al. ....................... 376/123 |
| 2005/0224182 | A1 | * | 10/2005 | Edamura et al. .......... 156/345.48 |
| 2006/0175016 | A1 | * | 8/2006 | Edamura et al. .......... 156/345.48 |
| 2008/0180194 | A1 | * | 7/2008 | Liu ................................. 334/89 |
| 2010/0066251 | A1 | * | 3/2010 | Nakagami et al. ........ 315/111.51 |

FOREIGN PATENT DOCUMENTS

| JP | H09-237698 A | 9/1997 |
|---|---|---|
| JP | H11-080965 A | 3/1999 |
| JP | 2004-537839 A | 12/2004 |
| JP | 2006-216903 A | 8/2006 |

OTHER PUBLICATIONS

International Search Report for PCT/JP2008/052461 dated May 20, 2008.
PCT Written Opinion of the International Searching Authority for PCT/JP2008/052461 dated May 20, 2008.
Japanese Notice of the reason for refusal dated Aug. 4, 2010.

* cited by examiner

*Primary Examiner* — Douglas W Owens
*Assistant Examiner* — Thai Pham
(74) *Attorney, Agent, or Firm* — Martine Penilla Group, LLP (57) ABSTRACT

The plasma generator of our invention comprises of the induction coil which is symmetric with respect to the reference plane between two terminal ends. Plasma processing gas is supplied to a predetermined space, and high frequency electricity is supplied to the induction coil, thereby the plasma generator generates plasma in the space. The reference plane passes between the two terminal ends and through longitude axis of the induction coil. The plasma generator can generate plasma with high quality of homogeneous.

21 Claims, 6 Drawing Sheets

RELATED ART

INDUCTION COIL, A PLASMA GENERATOR AND A PLASMA GENERATING METHOD

CROSS-REFERENCES TO RELATED APPLICATIONS

This Application is a CONTINUATION application claiming the benefit of priority of the co-pending International Patent Application No. PCT/JP2008/052461 with an international filing date of 14 FEB 2008 that designated the United States, which claims the benefit of priority of Japanese Patent Application No. 2007-037036, filed 16 Feb. 2007, the entire disclosures of all Applications are expressly incorporated by reference in their entirety herein.

BACKGROUND OF THE INVENTION (1) Field of the Invention

This invention relates to an induction coil for generating plasma, a plasma generator and a plasma generating method.

(2) Description of the Related Art

A plasma generator is provided as a plasma source (Inductive Plasma Source:IPS) to be used in a device for a semiconductor production or an etching, a surface treatment and vapor deposition using plasma. For example, the plasma generator comprises of a cylindrical chamber and an induction coil wound around the cylindrical chamber spirally. The other known plasma generators comprises of a planar spiral induction coil in the upper part of the chamber (cf. U.S. Pat. No. 4,948,458).

In such a plasma generator, processing gas is supplied in the chamber. In addition, when a high frequency (RF) electricity is supplied to the induction coil, the induction coil generates plasma in the chamber by circular eddy current.

There were following problems with the plasma generator using such induction coil. When a high frequency electricity is supplied to the induction coil, different electric potential is generated in each position on the coil due to the high frequency electricity along the induction coil. Then capacity characteristics electric current (capacitive current) is generated between each different positions of the electric potential. Such phenomenon causes heterogeneous electricity concentration in the chamber of the plasma generator.

Figure 7:
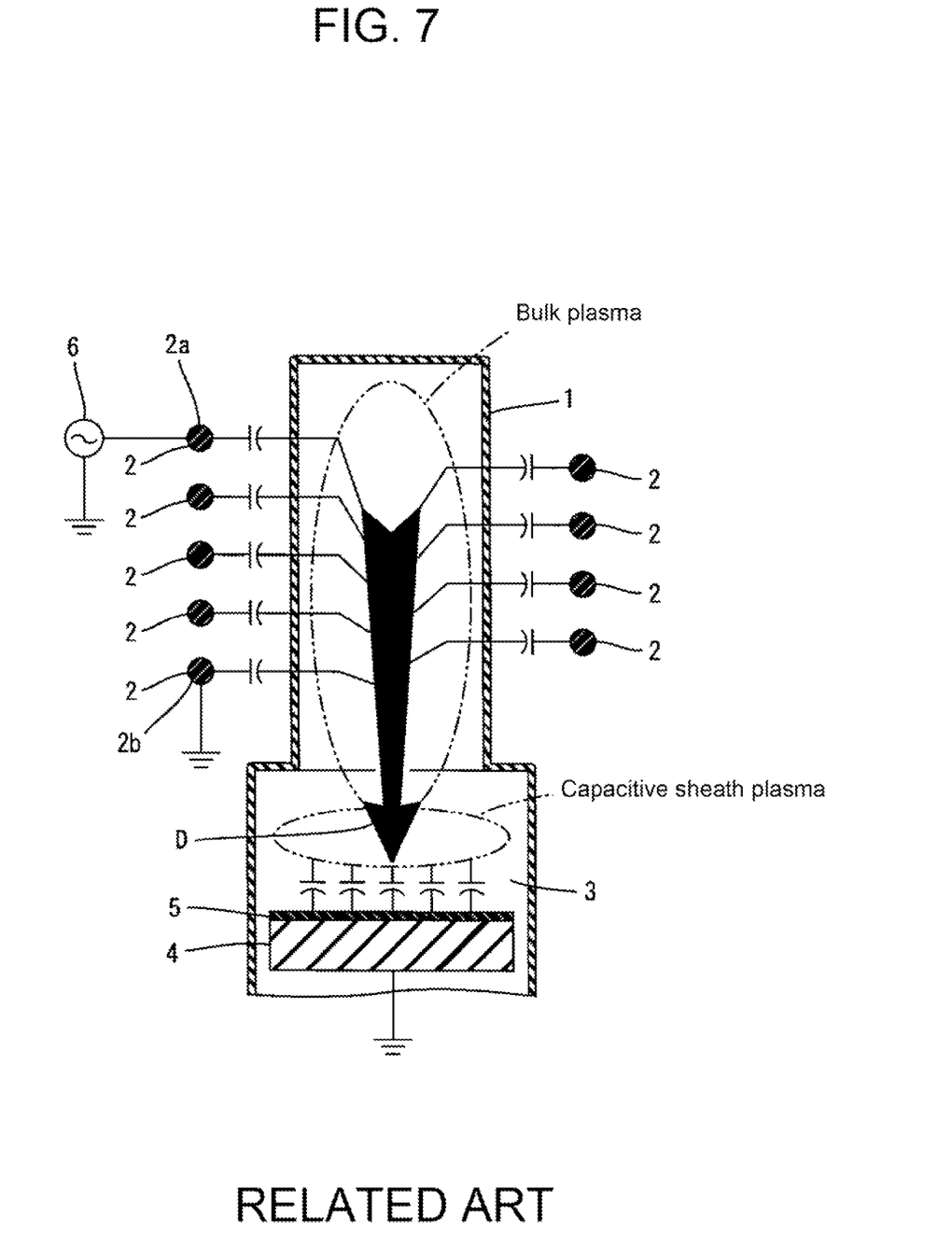
FIG. 7 is a diagrammatically view of the plasma generator in prior art.

FIG. 7 is a vertical section view showing an example of the conventional plasma generator.

The figure shows a cylindrical chamber 1 which generates plasma in itself, and an induction coil 2 which is wound up spirally in the cylindrical chamber 1. The induction coil 2 is shown with the sectional position only to simplify illustration. In addition, plasma processing space 3 and board support pedestal 4 in the space 3 are shown beneath the chamber 1.

Board support pedestal 4 supports a board 5 which is the object of the plasma processing. One end 2a of the both ends of the induction coil 2 is connected to high frequency power supply 6, and the other end 2b is connected to a ground. Then a potential difference occurs between these both ends 2a,2b, and capacitive current due to the positional relationship of both ends flows in the chamber 1 which is a plasma generating space.

The figure schematically shows general capacity characteristics current (the sum of a capacitive current flown from each position of the induction coil 2) generated in the chamber 1 as D.

The capacitive current generated as mentioned above causes inhomogeneity of the electric field in the chamber, and further causes inhomogeneity (non-uniformity) of the plasma generated in the chamber.

BRIEF SUMMARY OF THE INVENTION

This invention provides the induction coil, a plasma generator and a plasma generating method which generates the plasma of which uniformity is extremely high.

An induction coil for use in a plasma generator which generates plasma in a predetermined space, the induction coil having a winding part comprising of at least two plane horizontal turns, two terminals and being symmetrical with respect to a reference plane passing between the terminals through the longitudinal axis of the coil. In other words, general shape of the induction coil including positions and height of the two terminal is in symmetric shape at both sides of the reference plane. Said reference plane can be defined as a parallel plane which includes points which are in same distance from the two terminal ends and is parallel to vertical axis of the induction coil.

The concrete embodiment of the shape of such induction coil includes various variety of shapes. As an example, said induction coil has at least an intersection which intersects with said longitudinal axis, and comprises of winding part which is in shape of ring shape with respect to a vertical plane of the longitudinal axis of the induction coil, and terminal connecting parts which are linearly extended parts from the terminal ends which are close with each other toward direction of the longitudinal axis and the both ends of the lineally extended parts are connected with said two terminals.

The number of the intersection may be one or two, or more than two. In addition, when there is only an intersection, the induction coil is wound up in two turns. And when there are two intersections, the induction coil is wound up in three turns. In other words, the winding part has at least one intersection at intersecting place of the induction coil and the reference plane. In addition, in that case, the winding part has N-turns and the number of intersections is equal to N-1.

It is very natural that a plasma generator could be equipped with the induction coil characterized in the above mentioned shape. Therefore, the invention provides a plasma generator comprising: an induction coil having two terminals and being symmetrical with respect to a reference plane passing between the terminals through the longitudinal axis of the coil; and a treatment container (or process chamber) in which the induction coil is disposed at a predetermined position, wherein a high-frequency power is supplied to the induction coil so that plasma is generated.

In this case, the reference plane is a plane which passes between the two terminals through the longitudinal axis of the induction coil. In addition, in other words, said reference plane can be defined as a parallel plane which includes points which are in same distance from the two terminals and is parallel to vertical axis of the induction coil.

The plasma generator may comprising the treatment container which includes a wall member having one of two sides in which at least one first annular groove serving as a plasma generating space and the other side in which at least one second annular groove is formed so as to be concentric with the first annular groove, and the induction coil is accommodated in the second annular groove.

In addition, the invention can be defined not only as a device with real entity, but also can be defined as plasma generating method with the induction coil. Namely, the invention is the method of generating plasma in a predetermined space using an induction coil, comprising: supplying a plasma generation gas (processing gas) into a predetermined space in which is provided an induction coil having a winding part comprising of at least two plane horizontal turns, two terminals and being symmetrical with respect to a reference plane passing between the terminals through the longitudinal axis of the coil; and supplying high frequency power to the induction coil so that plasma is generated in the space.

The invention further can be defined as follows. In other words this invention is an induction type plasma generating method using an induction coil formed by winding a wire on a surface of a virtual column. And the induction coil comprises first and second terminals serving as a winding start and a winding end respectively and wires which are connected to the first and second terminals respectively thereby to be formed into a coil part; the wires wound from the respective first and second terminal sides are wound on the virtual column surface so as to be located at symmetrical positions with respect to the virtual column surface; the wires are wound so as to intersect each other in an insulated state when wound a half turn and are thereafter wound again so as to be located at symmetrical positions with respect to the virtual column surface, the wires being repeatedly wound and thereafter connected to each other.

With such structure, a high frequency power supply is connected to the first terminal and a variable capacitor is connected to the second terminal so that a potential at a middle point of the wires becomes approximately zero while both ends of the induction coil are at the same potential by the action of the variable capacitor, whereby a high frequency magnetic field is generated inside the induction coil by the high frequency power supplied to the induction coil, so that plasma is generated by action of the high frequency magnetic field while a potential of the plasma due to a capacitive current is rendered symmetrical.

According to the invention, since the induction coil is shaped as a symmetrical with respect to a reference plane between the two terminals, when high frequency electricity is supplied with the terminals so that the electric potential of both terminals become equal with each other, and the capacitive current provided by both terminals would have symmetricalness. As a result, homogeneity of generated plasma becomes extremely high.

DETAILED DESCRIPTION OF THE INVENTION

Figure 1:
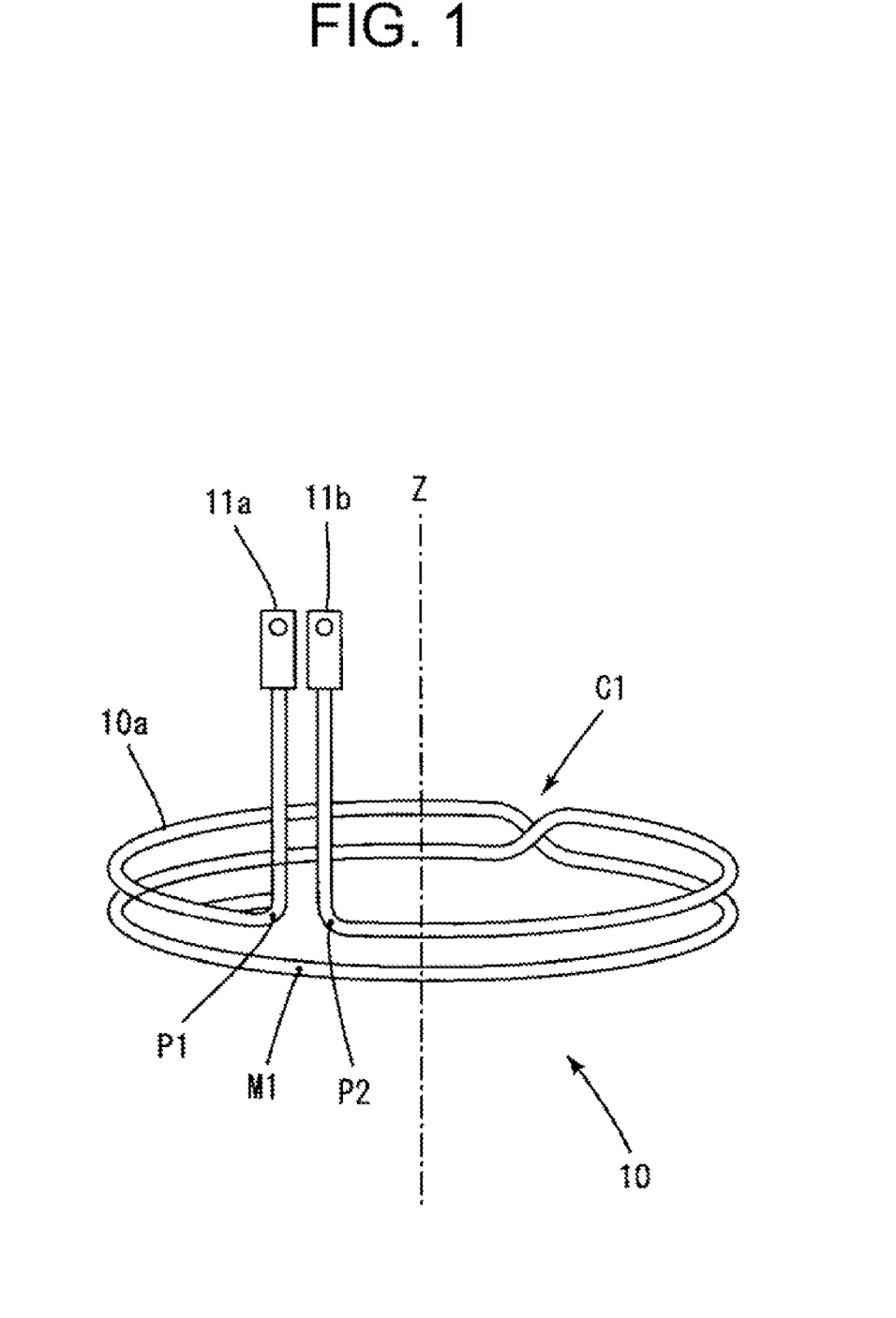
FIG. 1 is a perspective illustration which shows an example of the induction coil.

This invention will be explained in the following manner.
(1) The shape of the induction coil
(2) The example of the plasma generator
(3) An example of the result of the plasma processing
(1) The Shape of the Induction Coil FIG. 1 shows an example of an induction coil.

The induction coil 10 of this embodiment is wound up twice in a horizontal plane.

Induction coil 10 comprises the first terminal 11a and the second terminal 11b at the both ends of electric wire 10a. The induction coil 10 is symmetrical with respect to a reference plane which is parallel to an axis Z (a vertical axis) and includes midway point M1 of the equidistant from the first terminal 11a and the second terminal 11b, and also includes crossing point C1. Such plane is equivalent to the reference plane of this invention.

Figure 2:
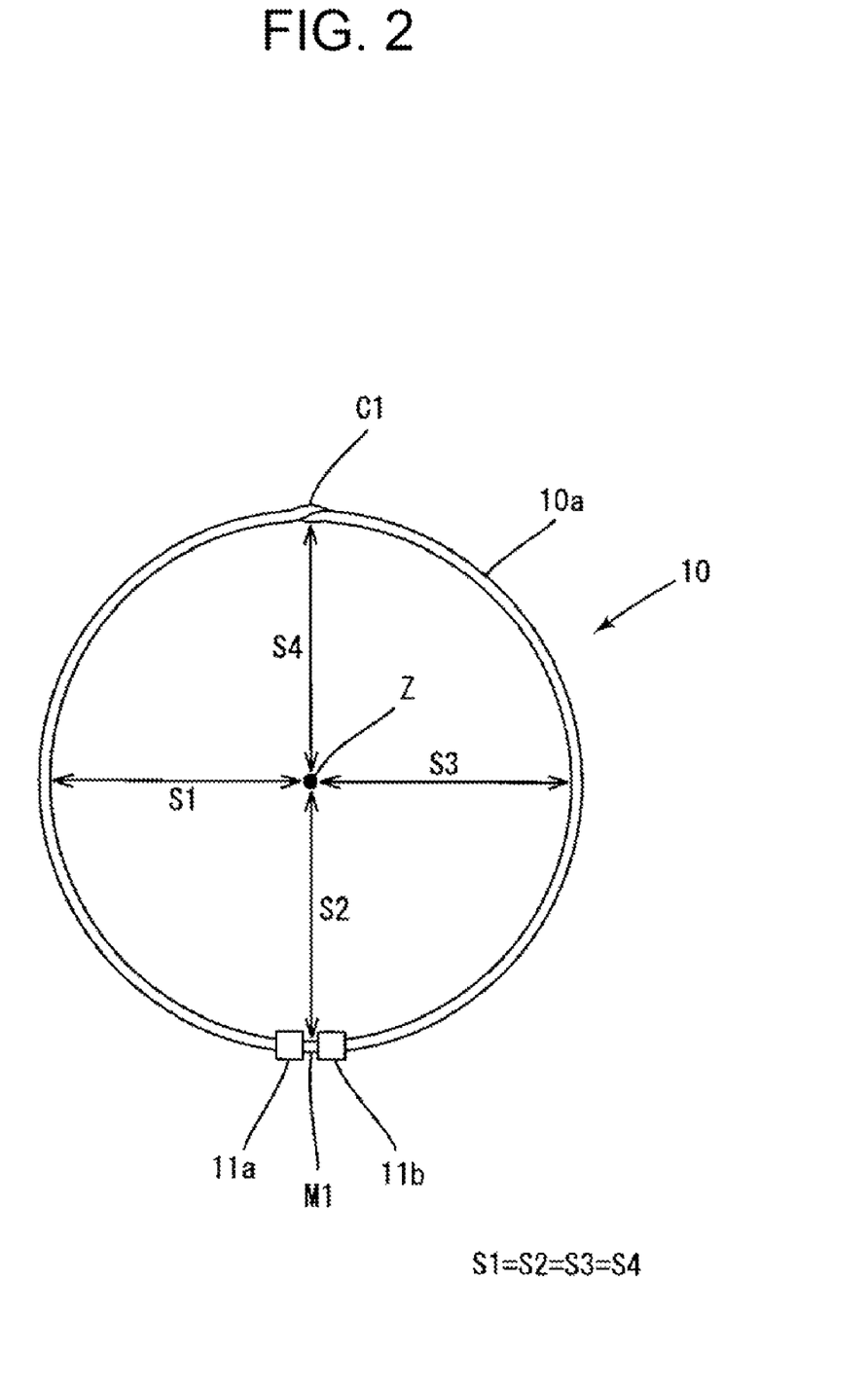
FIG. 2 is a top view of the induction coil.

FIG. 2 shows a top view of the induction coil 10.

The winding part of the induction coil 10 forms a circle. Axis Z passes through center position which is in equidistant from each position on the circular electric wire 10a.

The FIG. 2 shows each distance S1, S2, S3 and S4 from each position on electric wire 10a to axis Z are equal. Axis Z in the FIG. 2 is in direction which is perpendicular to a paper of FIG. 2.

In this embodiment, one of the first terminal 11a and the second terminal 11b is an terminal to be connected to a high frequency electricity power supply, and the other is a terminal to be connected to a variable condenser (variable capacitor). The first terminal 11a and the second terminal 11b come close each other and they are located at the same height position. The electric wire 10a which extends from the first terminal 11a and the electric wire 10a which extends from the second terminal 11b extends toward the axis Z of the induction coil 10 in same distance in a parallel state, and at positions P1, P2, they change their direction and extend toward oppositional and vertical with the axis Z direction. Further they extend in a circle on a plane which is vertical to the axis Z without changing their height. Therefore, a common circle is drawn by extending in an oppositional direction. The change of height in this embodiment without special remarks generally means a change of the height in the direction of the axis Z.

Where the reference place which includes midway point M1 of the equidistant from the first terminal 11a and the second terminal 11b and also includes crossing point C1 is presented, the electric wires 10a which extends from the first terminal II a and the electric wire 10a which extends from the second terminal 11b change their height in a same manner at a position where they cross the reference plane (please refer the crossing point C1 in the figure). Thereafter the electric wire 10a which extends from the first terminal 11a and the electric wire 10a which extends from the second terminal 11b extend respectively in a manner of depicting a circle without changing their height, and connect with each other where they reach the reference plane. The connecting point is a midway point M1 of the induction coil 10.

Namely the induction coil 10 is symmetrical with respect to the reference plane. The definition of the reference plane is not limited to the one explained above. For example, a plane which passes between the two terminals and through the axis of longitudinal core of the coil can be another definition of the reference plane, and the induction coil is also symmetrical with respect to such defined reference plane.

In this embodiment, the induction coil 10 has the cross point C1 where the electric wire 10a as the winding part cross thus defined reference plane. In addition, the number of the cross points will be equal to (N−1) when the electric wire 10a as the winding part is wound N turns. The shape of the induction coil of which almost all portion is symmetric with respect to the reference plane is not limited to the shape shown in the FIG. 1.

Figure 3:
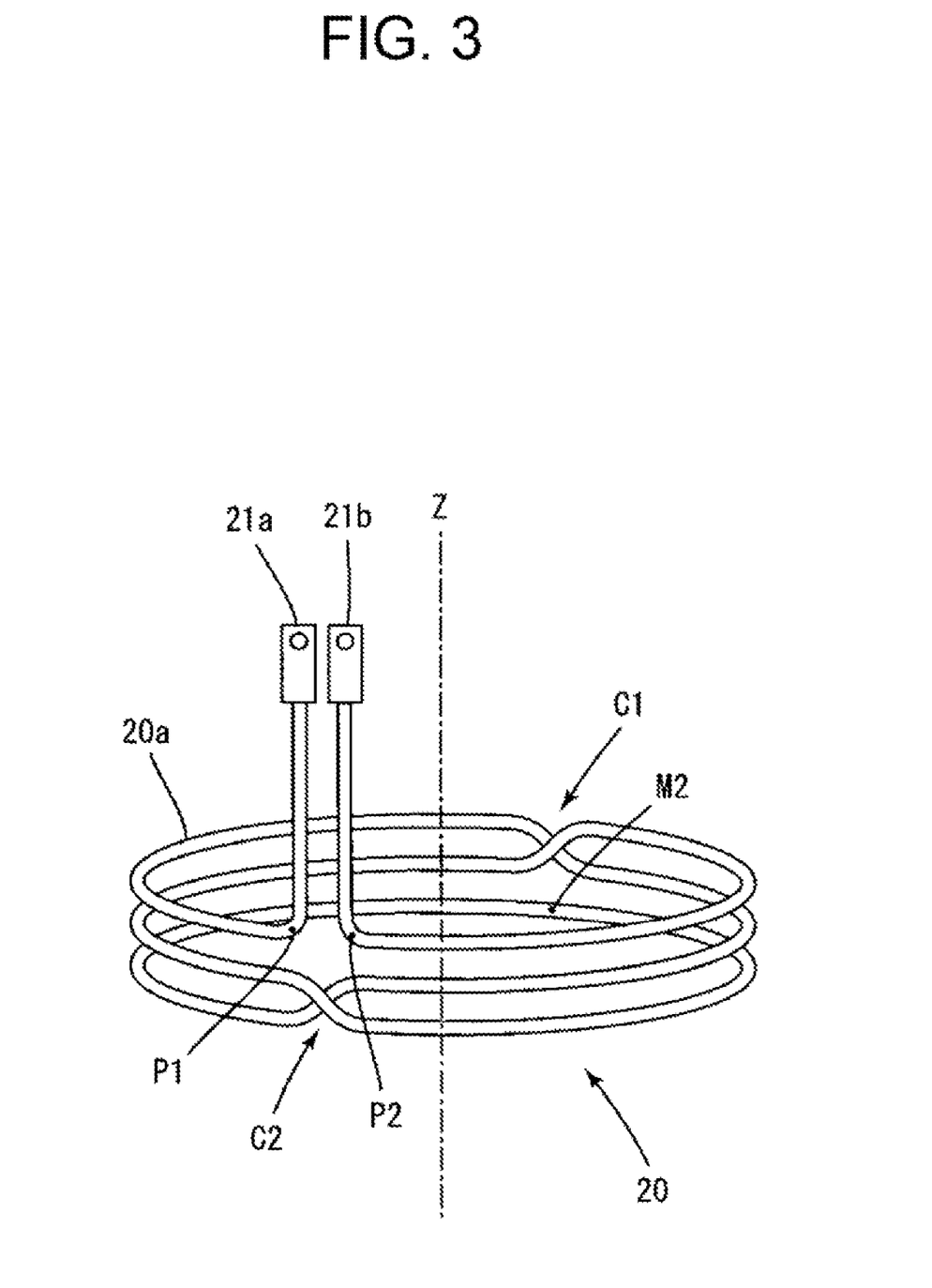
FIG. 3 is a perspective illustration which shows the other example of the induction coil.

FIG. 3 shows an induction coil 20 which is a example of this invention and is wound up 3 turns.

The difference between the induction coil 10 and the induction coil 20 is the number of intersection of an electric wire thereof. The number of intersection of an electric wire of the induction coil 10 is one, and the number of the induction coil 20 is two.

The induction coil 20 is symmetrical with respect to a reference plane which is parallel to an axis Z and includes midway point M1 of the equidistance from the first terminal 21a and the second terminal 21b, and includes crossing point C1. Axis Z of the induction coil 20 passes through center position which is in equidistance from each position on the circular electric wire 20a just like the induction coil 10.

The induction coil 20 is equipped with the first terminal 21a and the second terminal 21b at the both ends of the electric wire 20a like the induction coil 10. One of the first terminal 21a and the second terminal 21b is a terminal to be supplied with high frequency electricity from a power supply, and the other is a terminal to be connected to a variable condenser.

The electric wire 20a of the induction coil 20 intersects in the point equivalent to midway point M1 of the induction coil 10 without being connected (crossing C2 in the figure), and lowers its height. After being intersected, the electric wire 20a which extends from the first terminal 21a and the electric wire 20a which extends from the second terminal 21b further extends without changing its height in circle shape. At a place where they reach the reference plane (a downward position of crossing C1), the electric wire 20a which extends from the first terminal 21a and the electric wire 20a which extends from the second terminal 21b connect with each other. This connecting point is a midway point M2 of the induction coil 20.

A circular portion of electric wire 10a (20a) which forms induction coil 10 (20) corresponds to the winding part. The electric wire 10a (20a) extends from two points (P1, P2) which locate closely with each other on the highest (or lowest) circular part among a plurality of the circular rings toward parallel to axis Z. And portions of electric wire 10a (20a) between two points (P1, P2) and two ends thereof where the first terminal 11a (21a) and the second terminal 11b (21b) are connected correspond to the terminal connecting part.

Of course, if almost all portion of the induction coil is symmetric with respect to the reference plane between the both terminals, the shape of the induction coil of this invention is not limited to the one shown in the FIGS. 1 and 2.

An example using the induction coil 10 is explained in the following. However, in all situations where the induction coil 10 is used, other symmetrically shaped coil including the induction coil 20 can be replaced with.

The induction coil 10 (20) can be explained to comprise the first terminal 11a (21a) and the second terminal 11b (21b) serving as a winding start and a winding end respectively and electric wire 10a (20a) which are connected to the first terminal 11a (21a) and the second terminal 11b (21b) respectively thereby to be formed into a coil part; the electric wire 10a (20a) wound from the respective first terminal 11a (21a) and the second terminal 11b (21b) sides are wound on the virtual column surface so as to be located at symmetrical positions with respect to the virtual column surface; the electric wire 10a (20a) are wound so as to intersect each other in an insulated state when they are wound a half turn and are thereafter wound again so as to be located at symmetrical positions with respect to the virtual column surface, the wires being repeatedly wound and thereafter connected to each other.

In addition, various metal members suitable for producing coils including copper can be used as material of the induction coils 10,20. In addition, solid material or hollow material can be used for the full length of the electric wires of induction coils 10,20.

(2) The Example of the Plasma Generator

A plasma generator with induction coil 10 will be explained in detail. A method of the induction type plasma generation carried out by the plasma generator is a method of plasma generation of this invention.

Figure 4:
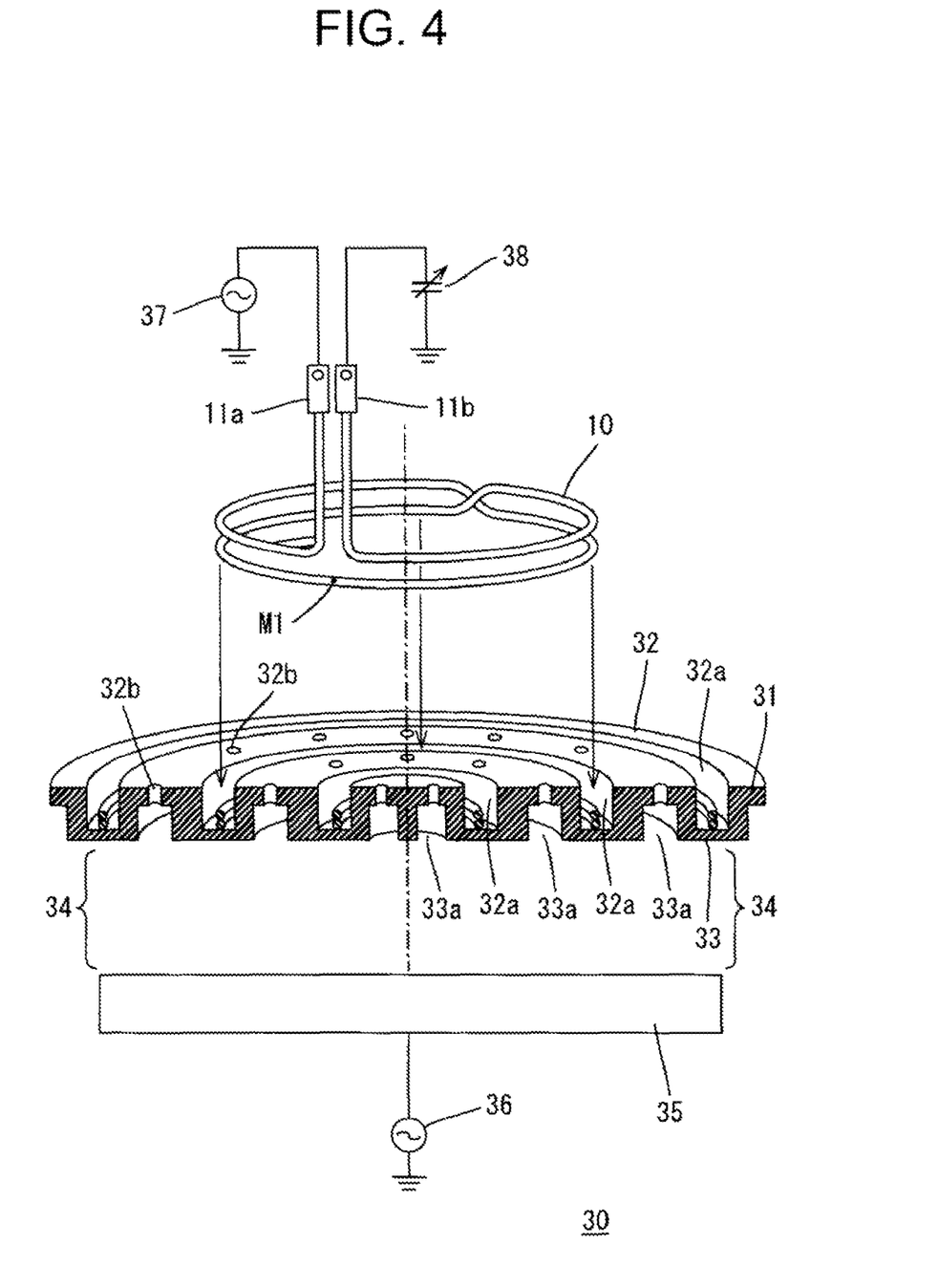
FIG. 4 is a part vertical section view which shows an example of the construction of the main part of the plasma generator.

FIG. 4 is a vertical section view which shows one part of main part of plasma generator 30.

Plasma generator 30 comprises a wall 31, which corresponds to the wall member, on a vacuum chamber, which corresponds to the process chamber, as a processing container. The upper wall 31 is formed as cylinder-shaped flat board members made by, for example, silicon, ceramic, sapphire, a quartz clock, or other dielectrics.

There is at least one (shown three in the figure) cannelure 32a on top surface 32 of the upper wall 31 concentrically. In addition, there is at least one cannelure 33a on lower surface 33 of the upper wall 31. Each cannelure 33a is located at a position of inner side toward center with respect to the corresponding cannelure 32a of the top surface 32 concentrically. In other words, the cannelure 32a and cannelure 33a are formed in turn toward center from outside of the disk shaped upper wall 31. Each cannelure 33a which open on lower surface 33 corresponds to the plasma generating space.

The induction coil 10 is set in the cannelure 32a of top surface 32. The figure shows the middle cannelure 32a of the three cannelure 32a holds the induction coil 10 inside. However, the other cannelures 32a also hold respective induction coils 10 of which diameter corresponds to each cannelures 32. Same induction coils 10 or induction coils 20 may be set in all cannelures 32a of the upper wall. Or, each cannelure 32a may hold only one of the induction coil 10 or the induction coil 20 respectively. A plurality of gas inlets are formed on each positions of top surface 32 which corresponds to a bottom of each cannelure 33a. Namely, when gas supply system is connected to the gas inlets 32b, processing gas for plasma generation is supplied to cannelure 33e, which corresponds to plasma generation space, through the gas inlets 32b.

Cathode 35 as a board support pedestal is located beneath the lower surface 33 at a predetermined distance away downward of lower surface 33. Cathode 35 is a pedestal to hold a board such as wafer for plasma processing including ashing, etching and sputtering on itself. And the space between the lower surface 33 and the cathode 35 is the plasma processing space 34. A power supply 36 of which output power is variable is connected to the cathode 35, and high frequency electricity is supplied by the power supply 36 to the cathode 35.

With this embodiment, the power supply 37 is connected to the first terminal 11a of the induction coil 10 which is placed in the upper wall 31, and is supplied with high frequency electricity. Further, the second terminal 11b is connected to a variable condenser 38.

Due to the effect of the variable condenser 38, electric potential of the both ends of induction coil 10 become equal value. As a result, since the electric potential of the midway point M1 between both ends of the induction coil 10 becomes 0, the electric potential of the plasma generated by the capacitive current becomes symmetric. A magnetic field is generated around upper wall 31, inside of the induction coil 10, when the induction coil 10 is supplied with electricity. And plasma will be generated in each cannelure 33a due to the effect of the generated magnetic field.

Various plasma processing mentioned above can be achieved by using the generated plasma as a work medium. It is preferable that distribution of the plasma is uniform in order to carry out such various plasma processing. In other words, plasma with extremely high uniformity will be generated by using the induction coil 10 or 20 which are formed to the above mentioned symmetrical shape in order to control the electric potential of the both ends and set in the upper wall of the vacuum chamber.

(3) An Example of the Result of the Plasma Processing

Figure 5:
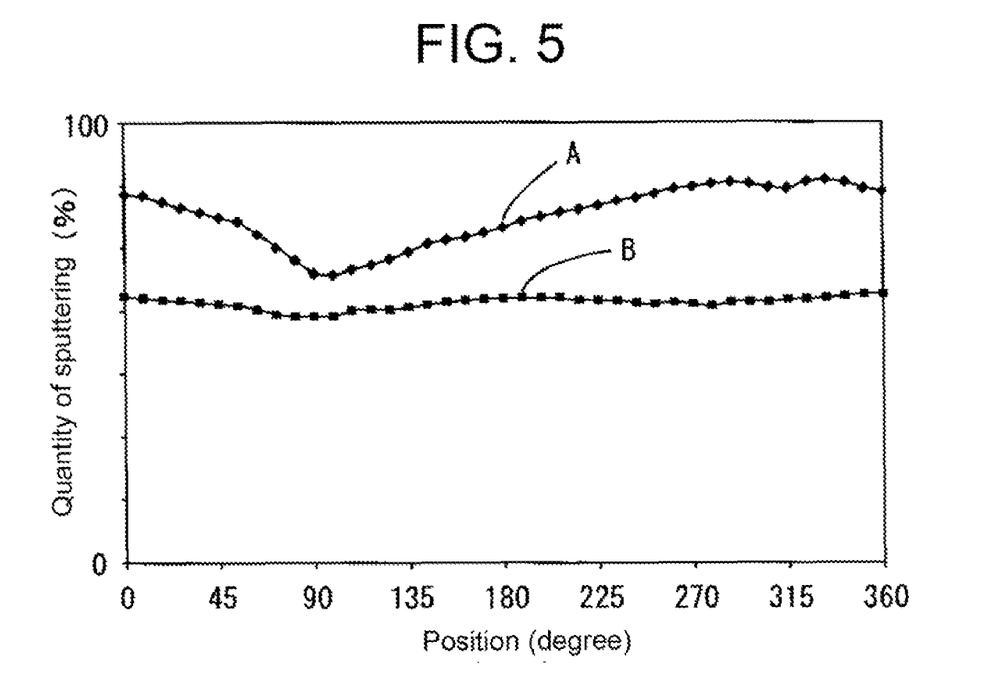
FIGS. 5 and 6 are figures which show a result of sputtering using plasma generated by a plasma generator of this invention.

FIG. 5 shows a graph for an example of the result of the plasma processing using the plasma generated by the plasma generator 30 as a work medium.

Figure 6:
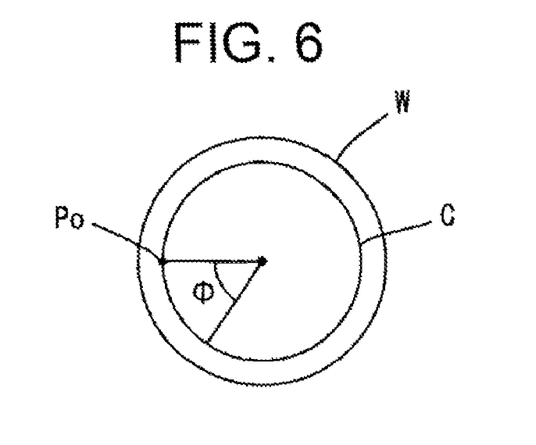

In the graph, the vertical axis of the graph corresponds to a rate of change of quantity of sputtering by the plasma generated by the plasma generator 30. On the other hand, the horizontal axis of the graph corresponds to a position on board W. More concretely, a circle C which is coaxial with the upper wall 31 is assumed on a board W as shown in FIG. 6. A reference position P0 (0 degree) is set on the circle C. A position on the circle C is defined by a degree FAI (0-360 degrees) in a fixed direction from the reference position P0.

A rate of change of the quantity of sputtering when the induction coil 10 (symmetrical type) is placed in the upper wall 31 is shown as line B in FIG. 5. Further, a rate of change of the sputtering quantity when a normal spiral induction coil (asymmetrical type) in substitution for the induction coil 10 is placed in the upper wall 31 is shown as line A.

According to the figure, the quantity of sputtering when a normal spiral induction coil (asymmetrical type) is used fluctuate very much with respect to each position on the board W. On the contrary, the quantity of sputtering when the induction coil 10 (symmetrical type) is used does not fluctuate so much with respect to each position on the board W. The rate of change of the quantity of sputtering with the induction coil 10 (symmetrical type) is about 4% whereas the rate of change of the quantity of sputtering with a normal spiral induction coil (asymmetrical type) is about 14%.

In other words, the plasma which I generated with above mentioned induction coil 10 keeps high uniformity as for sputtering quantity for all angles and in all diameter on board W as shown in the graph.

While the invention has been particularly shown and described with respect to preferred embodiments thereof, it should be understood by those skilled in the art that the foregoing and other changes in form and detail may be made therein without departing from the spirit and scope of the invention as defined in the appended claims.

What is claimed is:

1. A single induction coil for use in a plasma generator, the single induction coil comprising:
    a first terminal serving as a winding start;
    a second terminal serving as a winding end; and
    a plurality of wire portions, the wire portions connected to the first and second terminals, the wire portions are wound until a half turn on a virtual column surface to be located at symmetrical positions with respect to the virtual column surface, the wire portions are wound to intersect each other in an insulated state when wound at the half turn and are wound again after the half turn to be located at symmetrical positions with respect to the virtual column surface, the wire portions wound again after the half turn to be connected to each other to form a coil part, the wire portions having a different height after the half turn than a height of the wire portions before the half turn, the heights of the wire portions measured with respect to a longitudinal axis of the induction coil.

2. The single induction coil according to claim 1, wherein the coil part has N-turns and N−1 crossing points, wherein N is an integer greater than one.

3. The single induction coil according to claim 1, wherein the winding start is coupled with a radio frequency power supply.

4. The single induction coil according to claim 3, wherein the winding end is coupled with a ground via a variable capacitor.

5. The single induction coil according to claim 1, wherein the logical axis of the single induction coil passes through a position that is equidistant from each position on the coil part.

6. The single induction coil according to claim 1, wherein the wire portions intersect each other to cross each other.

7. A plasma generator comprising:
    a single induction coil including:
        a first terminal serving as a winding start;
        a second terminal serving as a winding end; and
        a plurality of wire portions, the wire portions connected to the first and second terminals, the wire portions are wound until a half turn on a virtual column surface to be located at symmetrical positions with respect to the virtual column surface, the wire portions are wound to intersect each other in an insulated state when wound at the half turn and are wound again after the half turn to be located at symmetrical positions with respect to the virtual column surface, the wire portions wound again after the half turn to be connected to each other to form a coil part, the wire portions having a different height after the half turn than a height of the wire portions before the half turn, the heights of the wire portions measured with respect to a longitudinal axis of the single induction coil;
    a treatment container in which the single induction coil is disposed at a predetermined position; and
    a high frequency power supply for supplying power to the single induction coil to generate plasma.

8. The plasma generator according to claim 7, wherein the treatment container includes a wall member having a first side and a second side, the first side having at least one first annular groove, the at least one first annular groove serving as a plasma generating space, the second side having at least one second annular groove, wherein the at least one second annular groove is concentric with the at least one first annular groove, and the single induction coil is accommodated in the second annular groove.

9. The plasma generator according to claim 7, wherein the coil part has N-turns and N−1 crossing points, wherein N is an integer greater than one.

10. The plasma generator according to claim 7, wherein the winding start is coupled with a radio frequency power supply and the winding end is coupled with a ground via a variable capacitor.

11. The plasma generator according to claim 7, wherein the longitudinal axis of the single induction coil passes through a position that is equidistant from each position on the coil part.

12. The plasma generator according to claim 7, wherein the wire portions intersect each other to cross each other.

13. A method of generating plasma in a space, the method comprising:
    supplying a plasma generation gas into a predetermined space in which is provided a single induction coil, wherein the single induction coil includes first and second terminals serving as a winding start and a winding end respectively, the single induction coil including wire portions, the wire portions connected to the first and second terminals, the wire portions from the respective first and second terminal sides are wound until a half turn on a virtual column surface to be located at symmetrical positions with respect to the virtual column surface, the wire portions are wound to intersect each other in an insulated state when wound at the half turn and are wound again after the half turn to be located at symmetrical positions with respect to the virtual column surface, the wire portions being connected to each other after the half turn to form a coil part, the wire portions having a different height after the half turn than a height of the wire portions before the half turn, the heights of the wire portions measured with respect to a longitudinal axis of the induction coil; and supplying high frequency power to the single induction coil so that the plasma is generated in the space.

14. The method of generating plasma according to claim 13, wherein the coil part has N-turns and N−1 crossing points, wherein N is an integer greater than one.

15. The method of generating plasma according to claim 13, wherein the winding end is coupled with a ground via a variable capacitor and the winding start is coupled with a radio frequency power supply.

16. The method of generating plasma according to claim 13, wherein the longitudinal axis of the single induction coil passes through a position that is equidistant from each position on the coil part.

17. The method of generating plasma according to claim 13, wherein the wire portions intersect each other to cross each other.

18. A method of forming a single induction coil, the method comprising:

winding wire portions of the single induction coil, the winding of the wire portions performed from respective first and second terminal sides on a virtual column surface, wherein said winding of the wire portions is performed to place the wire portions at symmetrical positions with respect to the virtual column surface, wherein said winding is performed until a half turn is reached;

intersecting the wire portions with each other in an insulated state when wound at the half turn;

winding the wire portions again after the half turn to be located at symmetrical positions with respect to the virtual column surface, wherein the winding of the wire portions again after the half turn is performed to provide the wire portions a different height after the half turn than a height of the wire portions before the half turn, the heights of the wire portions measured with respect to a longitudinal axis of the induction coil; and connecting the wire portions with each other after said winding the wire portions again is performed, wherein said connecting the wire portions is performed to form a coil part.

19. The method of forming a single induction coil according to claim 18, wherein said connecting the wire portions comprises connecting the wire portions to form the coil part that has N-turns and N−1 crossing points, wherein N is an integer greater than one.

20. The method of forming a single induction coil according to claim 18, further comprising:

coupling the winding end with a ground via a variable capacitor; and coupling the winding start with a radio frequency power supply.

21. The method of forming a single induction coil according to claim 18, wherein said intersecting the wire portions comprises crossing the wire portions with each other.

* * * * *